(12) United States Patent
Ohkawa

(10) Patent No.: US 6,414,375 B1
(45) Date of Patent: Jul. 2, 2002

(54) SEMICONDUCTOR DEVICE WITH METAL SILICIDE FILM ON PARTIAL AREA OF SUBSTRATE SURFACE AND ITS MANUFACTURE METHOD

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/236,091

(22) Filed: Jan. 25, 1999

(30) Foreign Application Priority Data

Aug. 20, 1998 (JP) .......................................... 10-234363

(51) Int. Cl.$^7$ ............................................. H01L 23/48
(52) U.S. Cl. ........................ 257/637; 257/306; 257/288
(58) Field of Search ................................ 257/306, 637, 257/288

(56) References Cited

U.S. PATENT DOCUMENTS

| | | | |
|---|---|---|---|
| 5,747,845 A | * 5/1998 | Iwasa ........................... | 257/306 |
| 5,895,239 A | * 4/1999 | Jeng et al. ................... | 438/239 |
| 5,973,343 A | * 10/1999 | Takaishi ...................... | 257/296 |
| 5,990,507 A | * 11/1999 | Mochizuki ................... | 257/295 |
| 5,994,762 A | * 11/1999 | Suwanai ...................... | 257/620 |
| 6,020,228 A | * 2/2000 | Asakura ....................... | 438/199 |
| 6,022,776 A | * 2/2000 | Lien et al. ................... | 438/253 |
| 6,028,360 A | * 2/2000 | Nakamura et al. .......... | 257/758 |
| 6,150,689 A | * 11/2000 | Narui et al. ................. | 257/306 |

FOREIGN PATENT DOCUMENTS

JP  1-264257  10/1989

* cited by examiner

Primary Examiner—Eddie Lee
Assistant Examiner—Lourdes Cruz
(74) Attorney, Agent, or Firm—Armstrong, Westerman, Hattori, McLeland & Naughton, LLP

(57) ABSTRACT

First and second regions are defined in a principal surface of a semiconductor substrate. Two projected structures are disposed on the principal surface of the first region and spaced apart by a certain distance. The two projected structures run on a first active region in the first region and on an element isolation region around the first active region. A first silicide film is formed on the surface of a partial active region in the principal surface in the second region. A burying member covers the side walls of the two projected structures and buries a space between the two projected structures at least in the element isolation region. The burying member is not formed above the two projected structures. A metal silicide film is not formed on the surface of the first active region.

15 Claims, 16 Drawing Sheets

SEMICONDUCTOR DEVICE WITH METAL SILICIDE FILM ON PARTIAL AREA OF SUBSTRATE SURFACE AND ITS MANUFACTURE METHOD

This application is based on Japanese patent application HEI 10-234363 filed on Aug. 20, 1998, the whole contents of which are incorporated herein by reference.

BACKGROUND OF THE INVENTION a) Field of the Invention

The present invention relates to a semiconductor device and its manufacture method, and more particularly to a semiconductor device with a metal silicide film formed on the surface of an active region of a semiconductor substrate and its manufacture method.

b) Description of the Related Art

In order to achieve high performance of semiconductor devices, it is effective to reduce the resistance and contact resistance of impurity doped regions and gate electrodes. As a method of reducing these resistances, a method (a salicide film forming method) is known which forms a metal silicide film in a self-alignment manner on the upper surface of a gate electrode and the surfaces of source/drain regions on both sides of the gate electrode. The metal silicide films reduce the resistance and contact resistance of the gate electrode and source/drain regions.

The salicide film forming method will be described briefly. Side spacer insulating films are formed on the side walls of a gate electrode. The side spacer insulating films electrically separate the surfaces of source/drain regions from the upper and side walls of the gate electrode. A metal film capable of silicification reaction is deposited covering the gate electrode and source/drain regions. The substrate is heated to silicidize the metal film with silicon. A metal silicide film is therefore formed on the upper surface of the gate electrode and the surfaces of the source/drain regions in a self-alignment manner.

In order to improve the data storage characteristics of a memory cell of a semiconductor device such as a dynamic random access memory (DRAM), it is desired to reduce junction leak current of an impurity doped region. However, if a metal silicide film is formed on the surface of an impurity doped region, the junction leak current increases (refer to the 178-th Meeting the Electro-chemical Society, pp. 218–220). From this reason, in DRAM manufacture, the salicide film forming method is not used in general.

If DRAM cells and logic circuits are formed on the same substrate and the salicide film forming method is not used, the resistances of gate electrodes, source/drain regions and the like of MOSFET's constituting logic circuits become high. It is therefore difficult to improve the performance of logic circuits. In order to improve the performance of logic circuits without shortening a storage time of DRAM cells, it is desired to apply the salicide film forming method only to MOSFET's of logic circuits.

SUMMARY OF THE INVENTION

It is an object of the present invention to provide a semiconductor device in which only desired regions among a plurality of active regions on the surface of a semiconductor substrate is silicidized, and its manufacture method.

According to one aspect of the present invention, there is provided a semiconductor device comprising: a semiconductor substrate having a principal surface defined with first and second regions; two projected patterns disposed spaced apart from each other by a certain distance and formed on the principal surface in the first region, the two projected patterns running on a first active and on an element isolation region around the first active region in the first region; a first metal silicide film formed on a surface of an active region in the principal surface in the second region; and a burying member for covering side walls of the two projected patterns and burying a space between the two projected patterns at least in the element isolation region, the burying member being not formed above the two projected patterns, wherein a metal silicide film is not formed on a surface of the first active region.

The resistance of a surface layer of the active region with the first metal sulicide film can be lowered. In the active region without the metal silicide film, junction leak current of the impurity dopes regions can be reduced.

According to another aspect of the invention, there is provided a semiconductor device comprising: a semiconductor substrate having a principal surface defined with first and second regions; first and second gate electrodes disposed spaced apart from each other by a certain distance and formed on the principal surface in the first region, the first and second gate electrode running on a first active region in the first region; a MOSPET formed in the second region; a first metal silicide film formed on surfaces of source/drain regions of the MOSFET; a second metal silicide film formed on upper surfaces of the first and second gate electrodes; a third metal silicide film formed on an upper surface of a gate electrode of the MOSFET; a first insulating member formed on the second metal silicide; a second insulating member covering side walls of the first and second gate electrodes and side walls of the first insulating member; and a third insulating member covering the source/drain regions of the MOSFET and the third metal silicide film and made of a same material as the first insulating member, an upper surface of the third insulating member being swelled upward in correspondence to the gate electrode of the MOSFET, wherein a metal silicide film is not formed on a surface of the first active region.

In the active region with the first metal silicide film, the resistance of the surface layer can be lowered. In the active region without the metal silicide film, junction leak current of the impurity dopes regions can be reduced. The upper surfaces and side walls of the first and second gate electrodes are covered with the first and second insulating members. If a contact hole is formed through an interlayer insulating film formed above the first and second gate electrodes under the conditions that the first and second insulating members are not etched, these first and second insulating members protect the first and second gate electrodes. The contact hole can therefore be formed in a self-alignment manner.

According to another aspect of the present invention, there is provided a method of manufacturing a semiconductor device comprising the steps of; preparing a semiconductor substrate having a principal surface defined with first and second active regions; forming first and second gate electrodes above the first active region of the semiconductor substrate, the first and second gate electrodes being made of silicon and spaced apart by a certain distance, and forming a third gate electrode made of silicon above the second active region; depositing an insulating film over the principal surface, the insulating film covering the first to third gate electrodes; anisotropically etching the insulating film to leave a portion of the insulating film so as to completely fill a space between the first and second gate electrodes and leave a portion of the insulating film on side walls of the third gate electrode, to thereby expose a surface of the second active region outside of the insulating film covering the side walls of the third gate electrode and expose upper surfaces of the first to third gate electrodes; and forming a metal silicide film on a surface of the exposed second active region and on the upper surfaces of the first to third gate electrodes.

A space between the first and second gate electrodes is filled with a portion of the insulating film. Since the silicon substrate surface is not exposed in the space therebetween, the metal silicide film will not be formed in this area.

According to another aspect of the present invention, there is provided a method of manufacturing a semiconductor device comprising: a deposition step of depositing a silicon film on a surface of a silicon substrate having a principal surface; a patterning step of patterning the silicon film to leave the silicon film in a first region of the principal surface and leave a first gate electrode made of the silicon film in an active region of a second region; a side spacer forming step of forming side spacer insulating members covering side walls of the first gate electrode; a first ion doping step of doping impurity ions into active regions on both side the first gate electrode; a metal silicide forming step of forming a metal silicide film on surfaces of the active regions outside of the side spacer insulating members, on an upper surface of the first gate electrode, and on a surface of the silicon film left in the first region; a second gate electrode forming step of patterning the silicon film and the metal silicide film formed thereon both left in the first region to leave a second gate electrode above the active region in the first region; and a second ion doping step of doping impurity ions into active regions on both sides of the second gate electrode.

During the metal silicide forming step, the silicon film is left in the first region. Therefore, the silicon surface in the first region is not subject to a silicification reaction. Only the surface of the active region in the second region can be subject to the silicification reaction.

As above, a metal silicide film is formed on the silicon surface in some area of the semiconductor substrate, and it is not formed in the other area. If this structure is applied to DRAM with logic circuits, a metal silicide film is formed on the surfaces of the source/drain regions of MOSFET's of the logic circuit area, and it is not formed on the surfaces of the source/drain regions in the memory cell array area. In the logic circuit area, the metal silicide film lowers the resistance of the source/drain regions of MOSFET to thereby improve the device performance. In the memory cell array area, the metal silicide film is not formed so that it is possible to prevent the storage time from being shortened.

DETAILED DESCRIPTION OF THE PREFERRED EMBODIMENTS

Figure 1A:
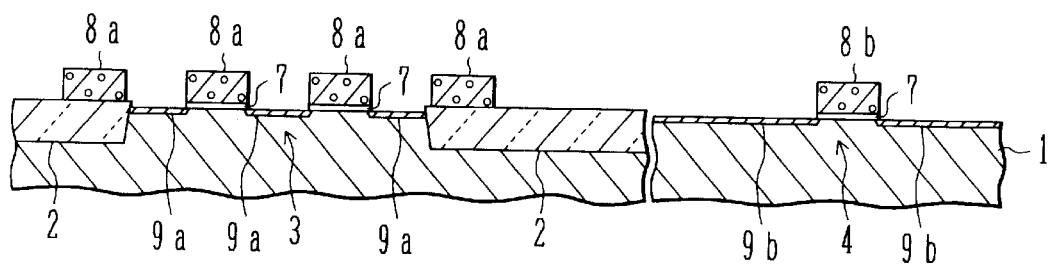
FIGS. 1A to 1C, 2A to 2C, 3, and 4 are cross sectional views of a substrate illustrating a method of manufacturing a semiconductor device according to a first embodiment of the invention.

With reference to FIGS. 1A to 5B, the first embodiment of the invention will be described. FIGS. 1A to 4 are cross sectional views of a substrate illustrating a method of manufacturing a semiconductor device according to the first embodiment of the invention. The left side of waved lines in each Figure shows a memory cell array area, and the right side shows a logic circuit area.

The processes up to the processes shown in FIG. 1A will be described first. On the surface of a p-type silicon substrate, shallow trench type element isolation structures 2 are formed by a well known method. The element isolation structures 2 define an a active region 3 in the memory cell array area and an active region 4 in the logic circuit area. On the surfaces of the active regions 3 and 4, gate oxide films 7 of $SiO_2$ are formed by thermal oxidation to a thickness of 4 to 10 nm. On the gate oxide film, a first polysilicon film is deposited to a thickness of 100 to 300 nm. For example, the first polysilicon film is deposited by chemical vapor deposition (CVD) using $SiH_4$.

The first polysilicon film is patterned to leave a plurality of word lines 8a in the memory cell array area and a gate electrode 8b in the logic circuit area. For example, the first polysilicon film is etched by reactive ion etching (RIE) using a mixture gas of $Cl_2$ and $O_3$. The word line 8a extends in a direction vertical to the drawing sheet of FIG. 1A, and the pitch between adjacent word lines 8a is 0.1 to 0.3 μm. Two word lines 8a extend over the active region 3. The word lines 8a also extend on the element isolation structures 2 on both sides of the active region 3. The gate electrode 8b in the logic circuit area is spaced by 0.3 μm from unrepresented gate electrodes or wiring patterns on both sides of the gate electrode 8b.

By using the word lines 8a and gate electrode 8b as a mask, impurity ions are implanted. In the n-channel MOSFET forming regions in the memory cell array area and logic circuit area, phosphorous (P) ions are implanted under the conditions of an acceleration energy of 10 to 30 keV and a dose of 2 to $5\times10^{13}$cm$^{-2}$. In the p-channel MOSFET forming regions in the logic circuit area, boron (B) ions are implanted under the conditions of an acceleration energy of 5 to 15 keV and a dose of 1 to $5\times10^{13}$cm$^{-2}$. With these ion implantation processes, source/drain regions 9a of MOSFET's are formed in the memory cell array area, and low impurity concentration source/drain regions 9b of the lightly doped drain (LDD) structure are formed in the logic circuit area.

Figure 1B:
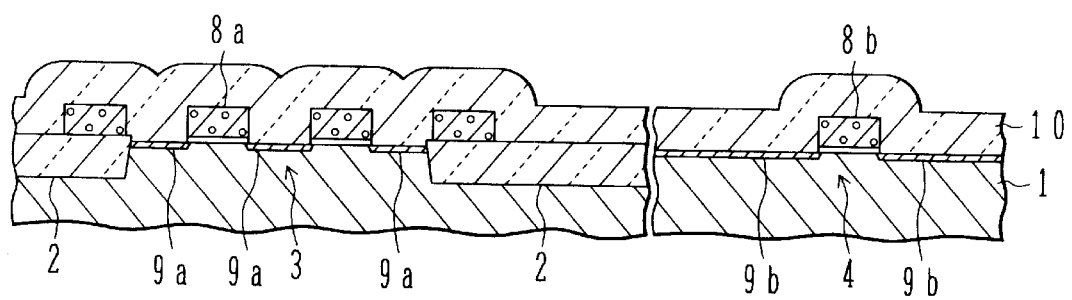

As shown in FIG. 1B, a first $SiO_2$ film 10 having a thickness of 80 to 200 nm is deposited over the substrate surface. For example, the first $SiO_2$ film 10 is deposited by CVD using $SiH_4$ and $O_2$. In the memory cell array area, spaces between the word lines 8a are buried with the first $SiO_2$ film 10.

Figure 1C:
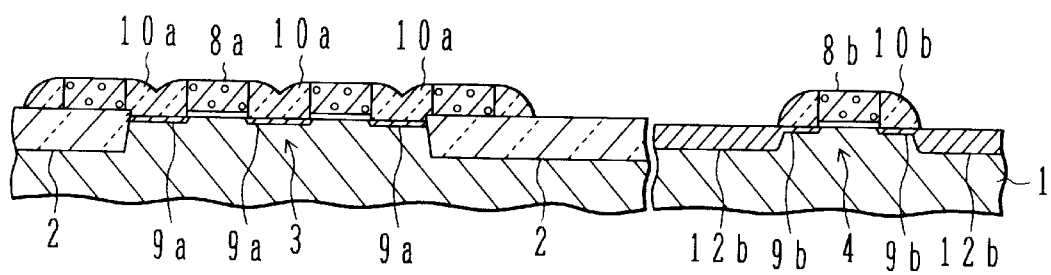

As shown in FIG. 1C, the first $SiO_2$ film 10 is anisotropically etched to remove the first $SiO_2$ film on the flat surface. For example, this anisotropic etching is performed by RIE using a mixture gas of $CH_4$, $CHF_3$, and Ar.

In the memory cell array area, burying materials 10a of the first $SiO_2$ film 10 are left between word lines 8a. The surface of the source/drain regions in the memory cell array area are covered with the burying materials 10a. In the logic circuit area, side spacer insulating members 10b are left on the side walls of the gate electrode 8b.

By using the gate electrodes 8b and side spacer insulating members 10b as a mask, ions are implanted into the logic circuit area while the memory cell array area is masked with a resist pattern. In the n-channel MOSFET forming region, arsenic (As) ions are implanted under the conditions of an acceleration energy of 30 to 50 keV and a dose of 1 to $4\times10^{15}$cm$^{-2}$. In the p-channel MOSFET forming region, B ions are implanted under the conditions of an acceleration energy of 5 to 15 keV and a dose of 1 to $4\times10^{15}$cm$^{-2}$. With these ion implantation processes, high impurity concentration source/drain regions 12b of the LDD structure are formed. After the ion implantation processes, natural oxide films on the exposed silicon surfaces are removed by hydrofluoric acid.

Figure 2A:
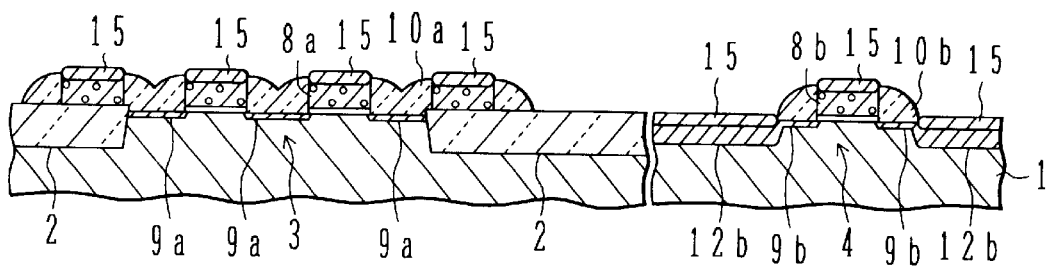

As shown in FIG. 2A, titanium silicide (TiSi) films 15 are formed on the surfaces of the word lines 8a, gate electrode 8b, and high impurity concentration regions 12b. A method of forming the TiSi film 15 will be described hereinunder. First, a Ti filmis deposited covering the whole surface of the substrate. Heat treatment is performed at a substrate temperature of 400 to 900° C. The Ti film is therefore silicidized with the silicon surface to form the TiSi film 15. Unnecessary Ti films not silicidized are removed by hydrofluoric acid. In the above manner, the TiSi film 15 can be formed in a self-alignment manner only on the exposed Si surfaces.

The surfaces of the source/drain regions 9a in the memory cell array area are covered with the burying materials 10a so that they are not silicidized. The high impurity source/drain regions 12b in the logic circuit area are in contact with the Ti film so that the regions 12b are silicidized at these contact surfaces. Instead of Ti, other metals capable of being silicidized with Si, such as Co, may be used.

Figure 2B:
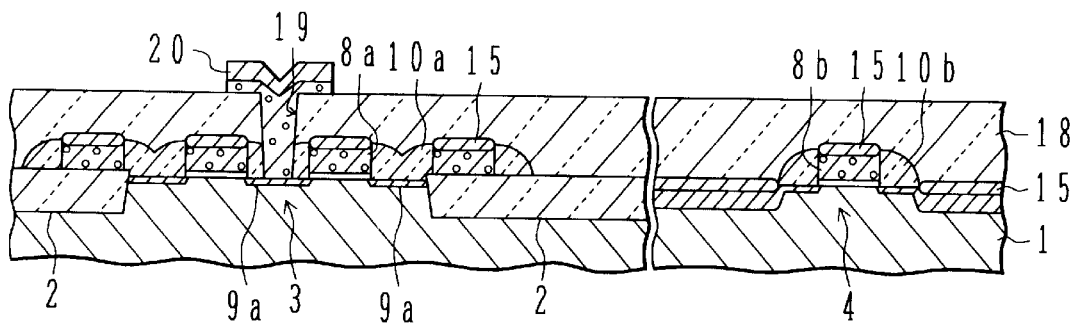

As shown in FIG. 2B, a borophosphosilicate glass (BPSG) 18 of 800 to 1200 in thickness is deposited over the whole surface of the substrate. The BPSG film 18 is deposited by CVD using a mixture gas of $SiH_4$, $B_2H_6$, $O_2$, and $PH_3$. After heat treatment at a substrate temperature of 700 to 850° C., the surface of the BPSG film 18 is planarized through chemical mechanical polishing (CMP).

A contact hole 19 is formed through the BPSG film 18 to expose the surface of the source/drain region 9a in the central area of the active region 3. Etching the BPSG film 18 is performed by RIE using a mixture gas of $CF_4$, $CHF_3$, and Ar. A bit line 20 is formed which is connected via the contact hole 19 to the central source/drain region 9a. The bit line 20 extends along a direction perpendicular to the word line 8a, in an area other than the cross section shown in FIG. 2B.

A method of forming the bit line 20 will be described hereinunder. A P-doped polysilicon film of 50 nm in thickness and a tungsten silicide ($WSi_2$) film of 100 nm in thickness are deposited over the whole surface of the substrate. The polysilicon film is deposited by CVD using $SiH_4$ as a source gas, and the $WSi_2$ film is deposited by CVD using $WF_6$ and $SiH_4$ as source gases. Prior to depositing the polysilicon film, a natural oxide film formed on the bottom of the contact hole 19 may be removed by hydrofluoric acid.

The polysilicon film and $WSi_2$ film are patterned to form the bit line 20. Etching the polysilicon film and $WSi_2$ film is performed by RIE using $Cl_2$ and $O_2$.

Figure 2C:
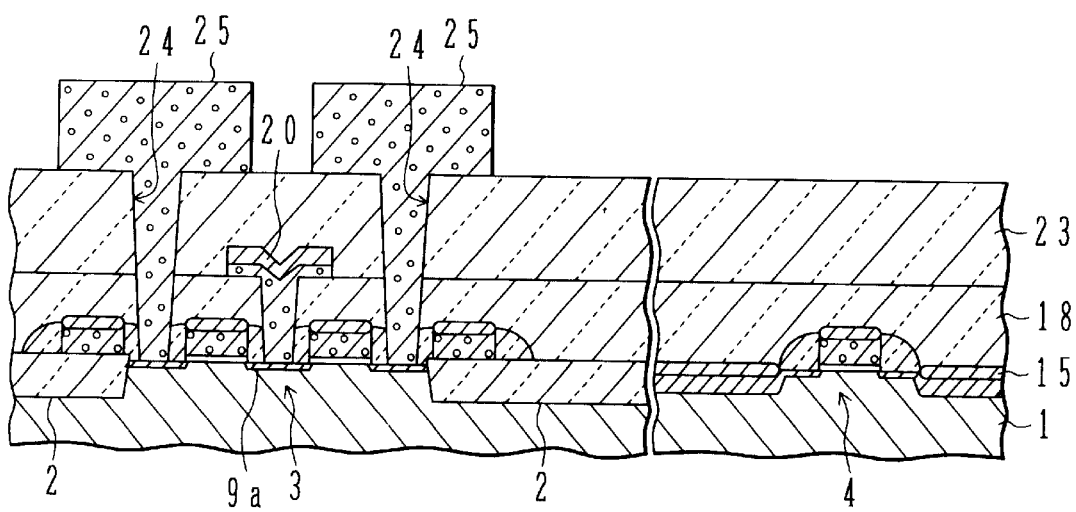

As shown in FIG. 2C, a BPSG film 23 is deposited to a thickness of 800 to 1200 nm over the substrate whole surface. After heat treatment at a substrate temperature of 700 to 850° C., the surface of the BPSG film 23 is planarized by CMP.

Contact holes 24 are formed through the BPSG film 23 to expose the surfaces of the source/drain regions 9a on opposite ends of the active region 3. A storage electrode 25 is formed which is connected via each contact hole 24 to the corresponding source/drain region 9a. The storage electrode 25 is formed by depositing a P-doped polysilicon film of 300 to 800 nm in thickness and thereafter patterning this film.

Figure 3:
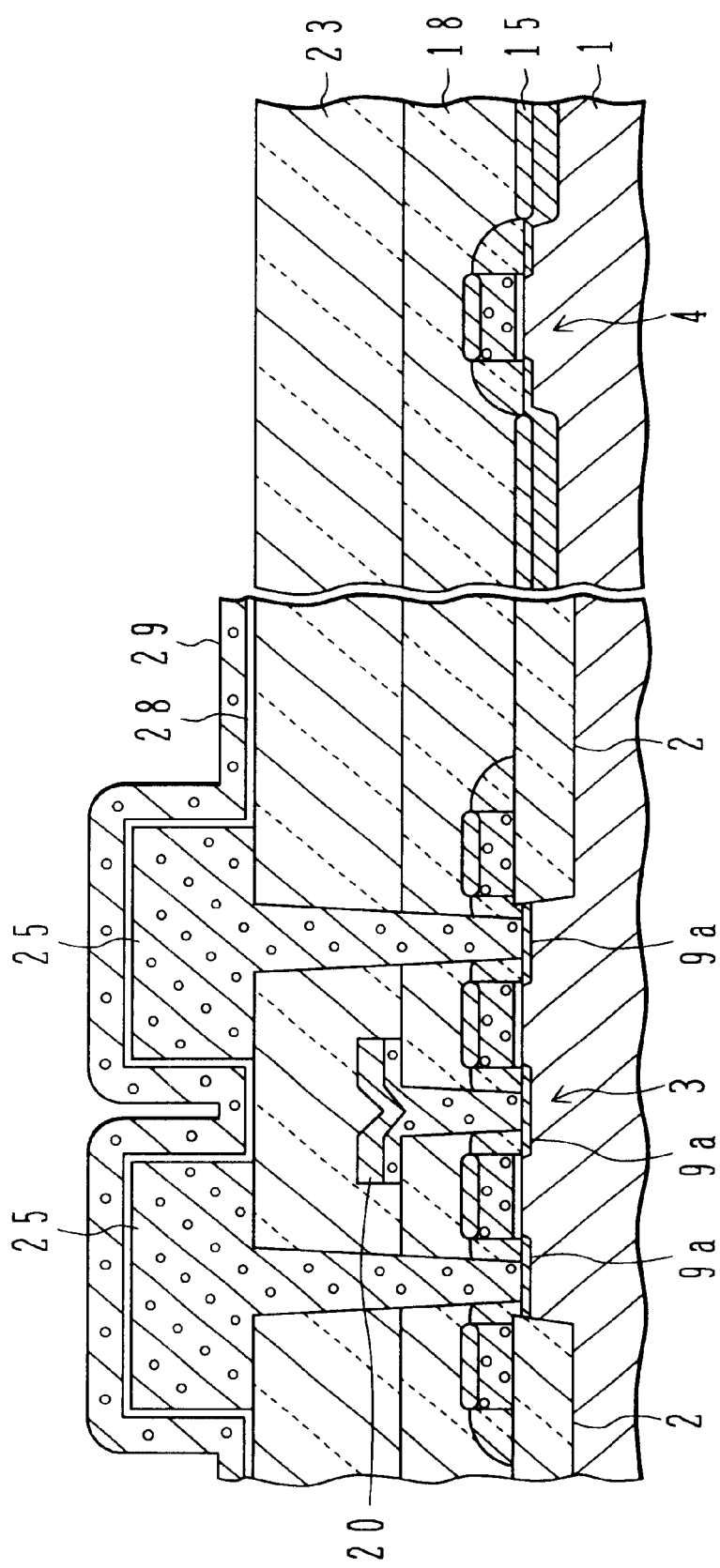

As shown in FIG. 3, a silicon nitride (SiN) film of 3 to 5 nm in thickness is deposited over the whole substrate surface. The SiN film is thermally oxidized at a temperature of 700 to 800° C. to form a dielectric film 28 made of SiON. An opposing electrode 29 of P-doped polysilicon is deposited to a thickness of 100 nm, covering the dielectric film 28. The dielectric film 28 and opposing electrode 29 in the logic circuit area are removed. Etching these two layers is performed by RIE using $Cl_2$ and $O_{2b}$.

Figure 4:
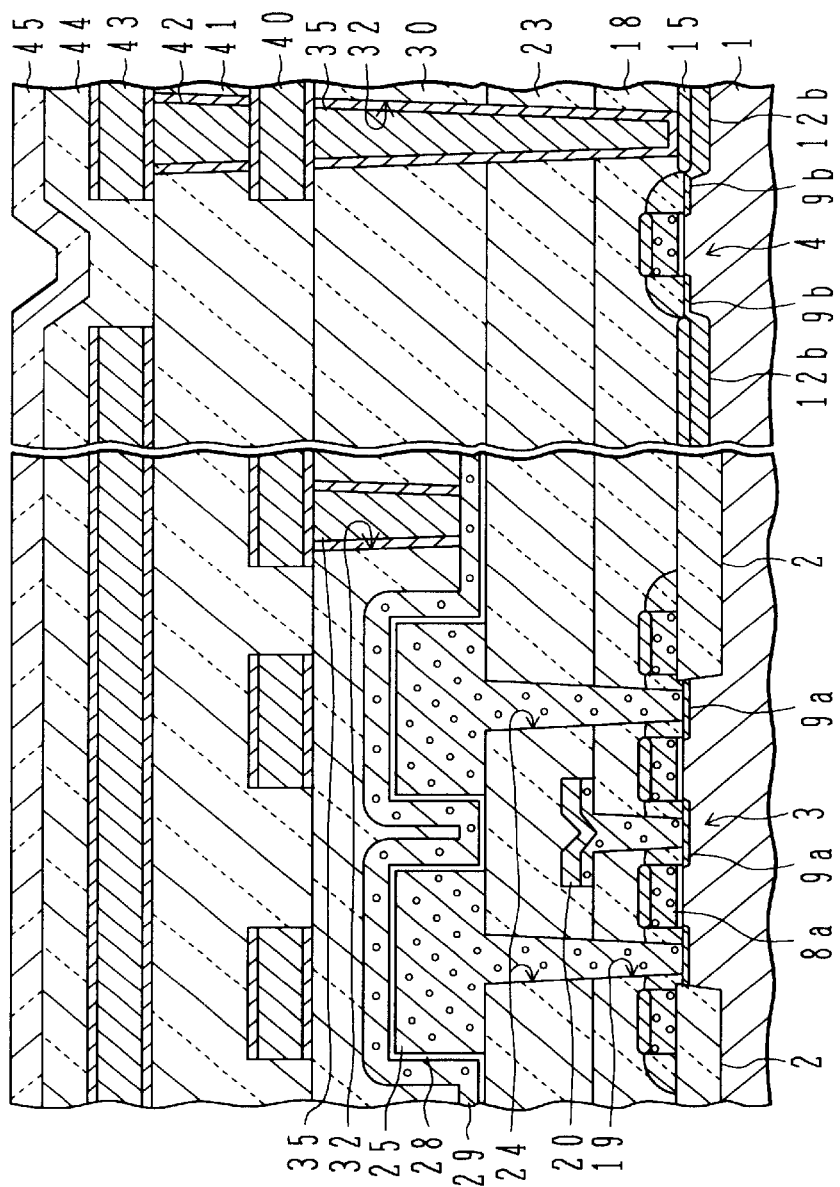

As shown in FIG. 4, a BPSG film 30 of 1000 to 1500 nm in thickness is deposited over the whole substrate surface. A contact hole 32 exposing a partial surface area of the opposing electrode 29 and a contact hole exposing a partial surface area of the TiSi film in the logic circuit area are formed. Although not shown in FIG. 4, a contact hole exposing a partial surface area of the bit line 20 is also formed at the same time.

The insides of the contact holes 32 are buried with W plugs 35. A method of forming a W plug 35 will be described hereinunder. First, a barrier metal layer is deposited through sputtering. For example, the barrier metal layer has a two-layer structure of a Ti film and a TiN film. A W film of 300 to 500 nm in thickness is deposited on the barrier metal layer by CVD to fill the insides of the contact holes with the W film. Unnecessary W films and barrier metal layers are removed by CMP to leave the W plugs 35 in the contact holes 32.

A wiring pattern 40 is formed on the BPSG film 30. The wiring pattern has a lamination structure of a barrier metal layer, an aluminum (Al) layer, and an antireflection film. For example, the antireflection film is made of TiN.

A $SiO_2$ film 41 is deposited on the BPSG film 30, covering the wiring pattern 40. For example, the $SiO_2$ film 41 is deposited by CVD using high density plasma. A contact hole is formed through the $SiO_2$ film 41 and the inside thereof is buried with a W plug 42. A wiring pattern 43 is formed on the surface of the $SiO_2$ film 41, and an $SiO_2$ film 44 is deposited covering the wiring pattern 43.

A cover film 45 is deposited covering the SiO$_2$ film 44. The cover film 45 has a two-layer structure of an SiO$_2$ film and an SiN film both formed by plasma CVD.

Figure 5A:
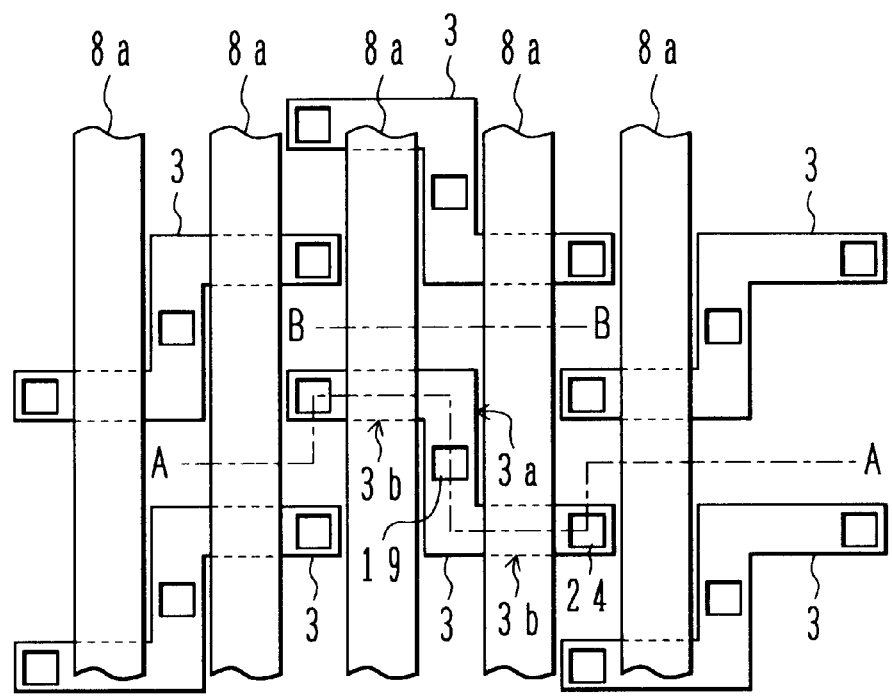
FIG. 5A is a plan view of a memory cell array area of a semiconductor device manufactured by the method of the first embodiment.

FIG. 5A shows an example of the layout of the memory cell array area of a semiconductor device manufactured by the method of the first embodiment. The cross sectional view of the memory cell array area shown in FIGS. 1A to 4 corresponds to a cross sectional view taken along one-dot chain line A—A in FIG. 5A. Active regions 3 are regularly disposed along vertical (column) and horizontal (row) directions in FIG. 5A. The active region 3 is constituted of a first region 3a extending in the column direction and a pair of second regions 3b extending in opposite directions from both ends of the first region 3a. The word line 8a traverses each second region 3b of the active region 3 in the column direction.

The contact hole 24 is disposed near the end of the second region 3b of the active region, via which contact hole the storage electrode 25 is connected to the source/drain region 9a. Approximately at the center of the first region 31, the contact hole 19 is disposed via which the bit line 20 is connected to the source/drain region 9a.

Figure 5B:
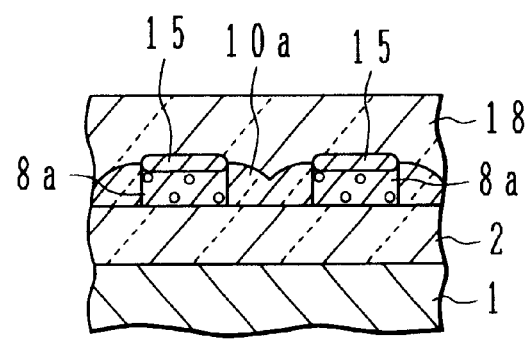
FIG. 5B is a cross sectional view taken along one-dot chain line B—B of FIG. 5A.

FIG. 5B is a cross sectional view taken along one-dot chain line B—B of FIG. 5A. The word line 8a runs on the element isolation structure 2. A space between two word lines 8a is filled with the burying material 10a. The burying material 10a does not exist on the word line 8a.

In the semiconductor device of the first embodiment, as shown in FIG. 4, a metal silicide film is not formed on the surfaces of the source/drain regions 9a in the memory cell array area. It is therefore possible to suppress an increase of junction leak current in the source/drain regions 9a and to maintain good storage time characteristics of DRAM.

Next, with reference to FIGS. 6A to 6D, the second embodiment will be described. The processes up to those shown in FIG. 1A are similar to the first embodiment. The methods For ion implantation, thin film formation, etching, and the like used in the processes in the second and following embodiments are similar to the first embodiment, and the detailed description thereof is omitted.

Figure 6A:
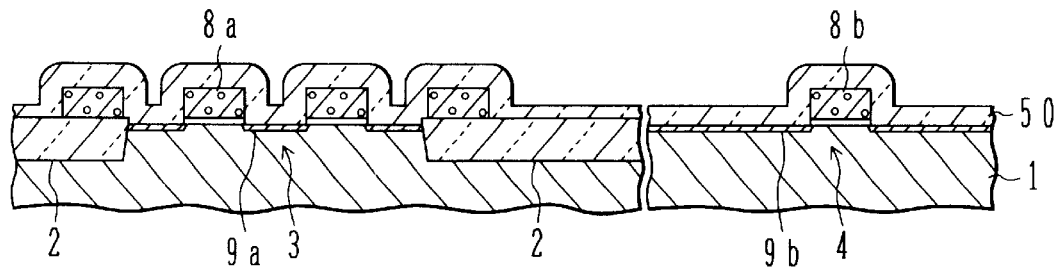
FIGS. 6A to 6D are cross sectional views of a substrate illustrating a method of manufacturing a semiconductor device according to a second embodiment of the invention.

As shown in FIG. 6A, a first SiO$_2$ film 50 of 40 to 200 nm is deposited over the whole substrate surface. In the first embodiment, the first SiO$_2$ film 10 deposited by the process shown in FIG. 1B has a thickness of 80 to 200 nm. The first SiO$_2$ film of the second embodiment is thinner than the first SiO$_2$ film 10.

Figure 6B:
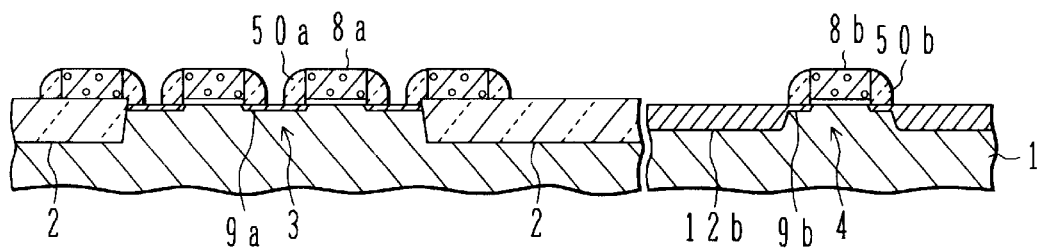

As shown in FIG. 6B, the first SiO$_2$ film is anisotropically etched by RIE to leave first side spacer insulating members 50a and 50b on the side walls of the word lines 8a and gate electrode 8b. Since the first SiO$_2$ film 50 is thinner than the first embodiment, the source/drain regions 9a are exposed between the first side spacer insulating members 50a also in the memory cell array area.

By using the gate electrode 8b and the first side spacer insulating members 50b as a mask, impurity ions are implanted into the surface layers of the active region 4 in the logic circuit area, while the memory cell array area is masked with a resist pattern. High impurity concentration source/drain regions 12b of the LDD structure are therefore formed.

Figure 6C:
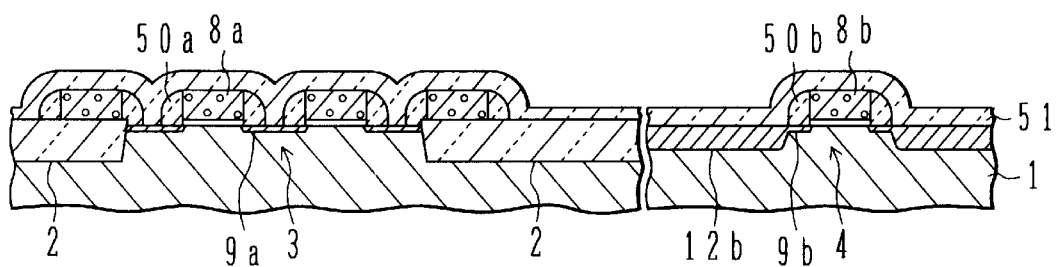

As shown in FIG. 6C, a second SiO$_2$ film 51 of 40 to 200 nm is deposited over the whole substrate surface. The second SiO$_2$ film 51 fills the spaces between the word lies 8a in the memory cell array area.

Figure 6D:
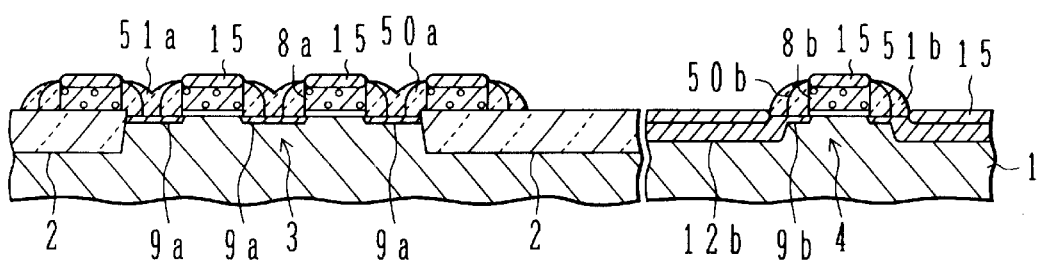

As shown in FIG. 6D, the second SiO$_2$ film 51 is anisotropically etched to leave second side spacer insulating members 51a and 51b on the side walls of the first side spacer insulating members 50a and 50b. Thereafter, similar to the processes of the first embodiment shown in FIG. 2A, a metal silicide film 15 is formed on the silicon surface.

In the second embodiment, since the spaces between the word lines 8a are filled with the second SiO$_2$ film 51, the first SiO$_2$ film 50 can be made thin. As the first SiO$_2$ film 50 is made thin, the first side spacer insulating member 50b shown in FIG. 6B is made thin so that the low impurity concentration regions 9b of the source/drain regions are made shorter. Accordingly, the performance of MOSFET's in the logic circuit area can be improved.

Also in the second embodiment, the end of the metal silicide film formed on the source/drain region of MOSFET in the logic circuit area, the end being on the side of the gate electrode, retracts from the end of the high impurity concentration region 12b on the side of the gate electrode.

Next, with reference to FIGS. 7A to 7C, the third embodiment will be described. The second side spacer insulating members 51b shown in FIG. 6D are formed by basically using similar processes to the second embodiment.

Figure 7A:
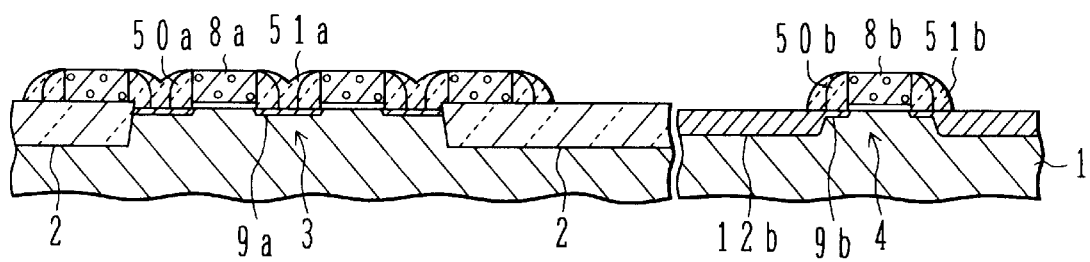
FIGS. 7A to 7C are cross sectional views of a substrate illustrating a method of manufacturing a semiconductor device according to a third embodiment of the invention.

FIG. 7A shows a substrate after the second side spacer insulating members 51b are formed. In the second embodiment, both the first and second side spacer insulating members 50a, 50b, 51a, and 51b are made of SiO$_2$ films deposited by the same method.

In the third embodiment, the first side spacer insulating members 50a and 50b are made of an SiO$_2$ film deposited by CVD using SiH$_4$ and O$_2$ at a substrate temperature of 750 to 800° C. The second side spacer insulating members 51a and 51b are made of a borosilicate glass (BSG) film or a phosphosilicate glass (PSG) film. These films are formed by CVD at a substrate temperature of 300 to 500 ° C. An etching rate of the BSG and PSG films relative to hydrofluoric acid is faster than an etching rate of an SiO$_2$ film deposited by high temperature CVD.

Figure 7B:
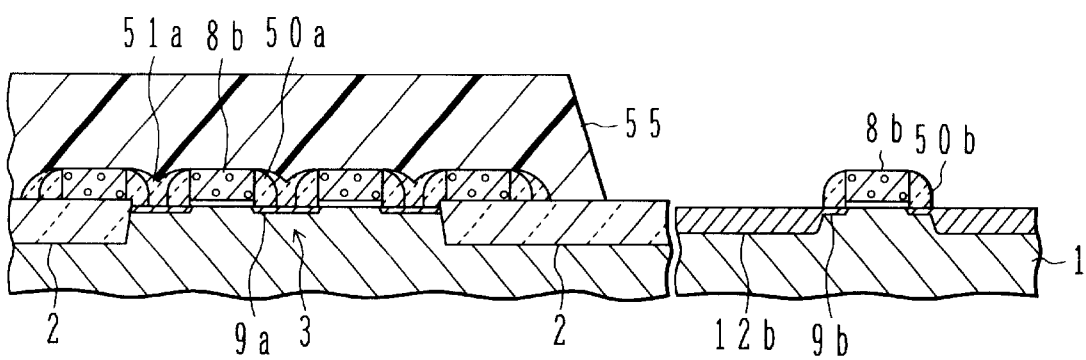

As shown in FIG. 7B, after the memory cell array area is covered with a resist pattern 55, the second side spacer insulating members 51b in the logic circuit area are removed by hydrofluoric acid. Since the etching rate of the first side spacer insulating members 50b is relatively slow, the first side spacer insulating members 50b can be left with high reproductivity. After the second side spacer insulating members 51b are removed, the resist pattern 55 is removed.

Figure 7C:
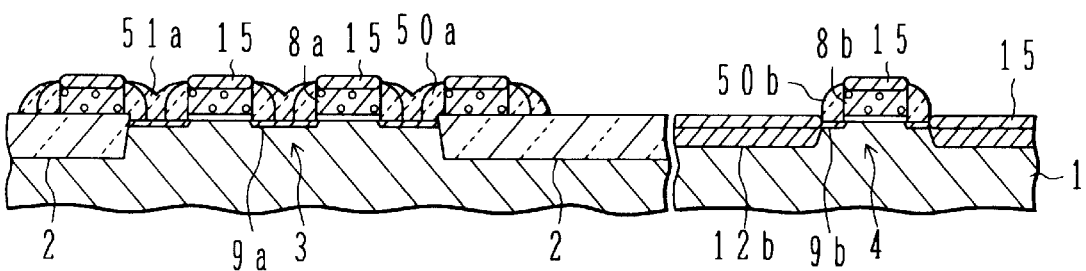

As shown in FIG. 7C, a metal silicide film 15 is formed on the silicon surface by processes similar to the first embodiment shown in FIG. 2A.

In the third embodiment, the end of the metal silicide film 15 formed on the source/drain region in the logic circuit area is in contact with the first side spacer insulating member 50b. Namely, as compared to the second embodiment, the end of the metal silicide film 15 on the source/drain region comes near the gate electrode 8b. Therefore, the resistance of the source/drain region can be lowered.

Next, with reference to FIGS. 8A to 8C, the fourth embodiment will be described. A substrate shown in FIG. 6B is formed by processes similar to the second embodiment.

Figure 8A:
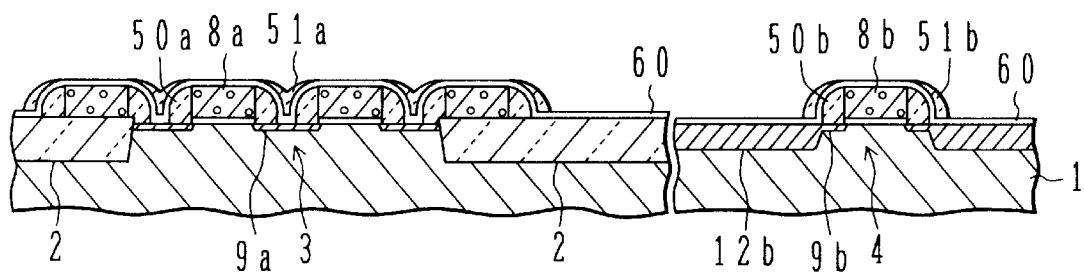
FIGS. 8A to 8C are cross sectional views of a substrate illustrating a method of manufacturing a semiconductor device according to a fourth embodiment of the invention.

As shown in FIG. 8A, an SiN film 60 of 10 to 30 nm in thickness is deposited over the whole substrate surface.

An SiO$_2$ film is deposited on the SiN film 60 to a thickness of 40 to 200 nm and anisotropically etched to leave second side spacer insulating members 51a and 51b on the sloped surface of the SiN film. This anisotropic etching is performed by RIE using a mixture gas of C$_4$F$_8$ and Ar under the conditions of a larger etching selection ratio relative to the SiN film. Spaces between word lines 8a in the memory cell array area are buried with the first side spacer insulating member 50a, SiN film 60, and second side spacer insulating member 51a.

Figure 8B:
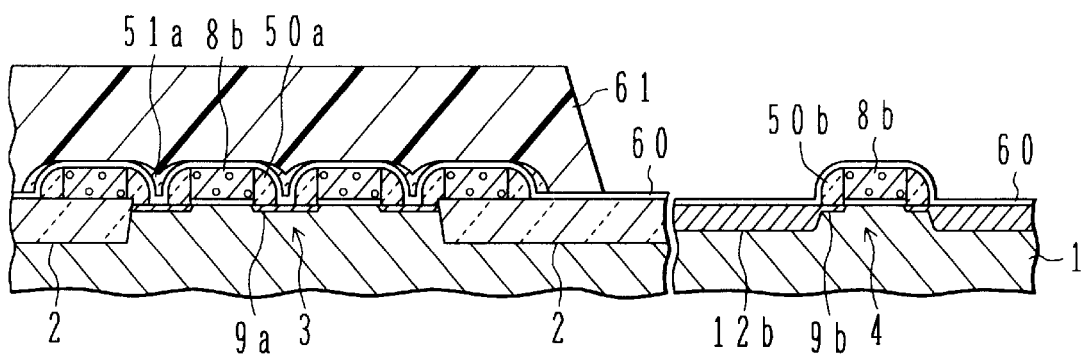

As shown in FIG. 8B, the memory cell array area is covered with a resist pattern 61, and the second side spacer insulating members 51b in the logic circuit area are removed. Etching the second side spacer insulating members 51b is performed by using hydrofluoric acid or hydrofluoric acid vapor. The second side spacer insulating members 51b can be selectively removed by leaving the SiN film 60 unetched.

After the second side spacer insulating materials 51b are removed, the resist pattern 61 is removed.

Figure 8C:
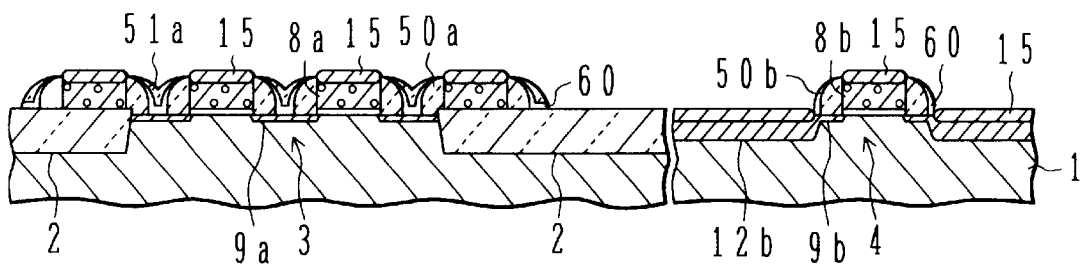

As shown in FIG. 8C, the SiN film 60 is anisotropically etched to remove the SiN film 60 in the flat surface. This etching is performed by RIE using a mixture gas of $CF_4$, $CHF_3$, and Ar. This etching gas provides a small etching selection ratio of the SiN film to the $SiO_2$ film. Therefore, the surface layer of the second side spacer insulating member 51a is slightly etched so that the boundary of the second side spacer insulating film 51a smoothly couples on the upper surface of the SiN film 60.

Spaces between the word lines 8a are buried with the first side spacer insulating members 50a, SiN film 60, and second side spacer insulating members 51a. The SiN film 60 covers partial areas of the side walls of the first side spacer insulating members 50a and the surface of the source/drain regions 9a. The second side spacer insulating member 51a covers the surface of the SiN film 60. The SiN film 60 is also left on the side walls of the first side spacer insulating members 50b in the logic circuit area.

A metal silicide film 15 is formed on the silicon surface by processes similar to the first embodiment shown in FIG. 2A.

In the fourth embodiment, the end of the metal silicide film 15 formed on the source/drain region in the logic circuit area contacts the SiN film 60. The resistance of the source/drain region can therefore be lowered similar to the third embodiment.

Next, with reference to FIGS. 9A to 9D, the fifth embodiment will be described. A substrate shown in FIG. 6A. is formed by processes similar to the second embodiment.

Figure 9A:
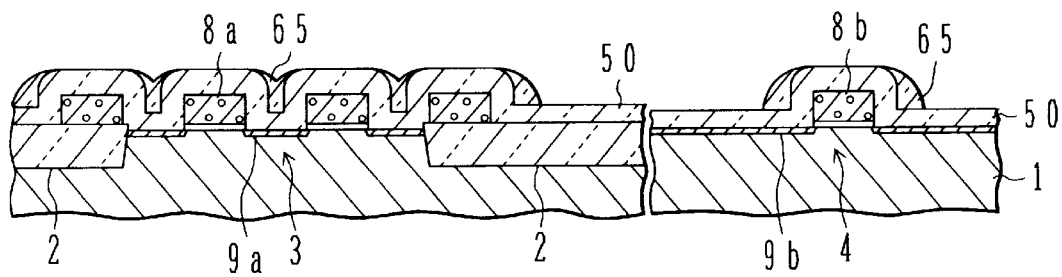
FIGS. 9A to 9D are cross sectional views of a substrate illustrating a method of manufacturing a semiconductor device according to a fifth embodiment of the invention.

As shown in FIG. 9A, on the slanted surfaces and side walls of the first $SiO_2$ film 50, side spacer insulating members 65 of BSG, PSG, or BPSG are formed. The side spacer insulating member 65 has an etching rate sufficiently faster than that of the first $SiO_2$ film relative to hydrofluoric acid. Spaces between the word lines 8a are buried with the first $SiO_2$ film 50 and side spacer insulating members 65f.

Figure 9B:
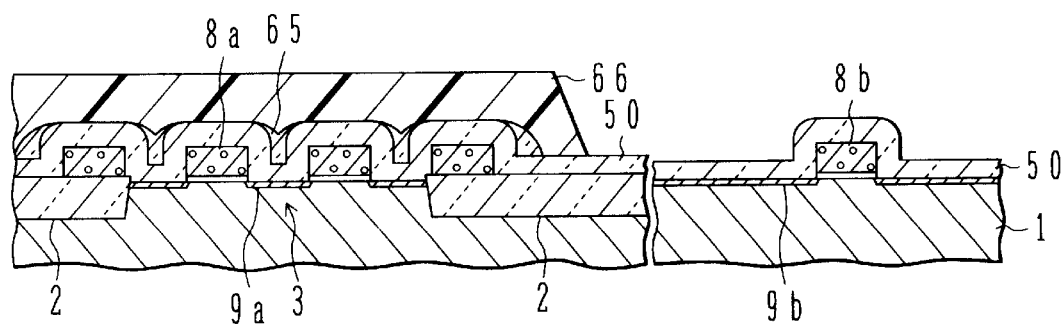

As shown in FIG. 9B, the memory cell array area is covered with a resist pattern 66. The side spacer insulating members 65 in the logic circuit area are removed by using hydrofluoric acid. Since the first $SiO_2$ film 50 has a higher resistance to etching than the side spacer insulating members 65 relative to hydrofluoric acid, the first $SiO_2$ film 50 can be left unetched with high reproductivity. After the side spacer insulating members 65 are removed, the resist pattern 66 is removed.

Figure 9C:
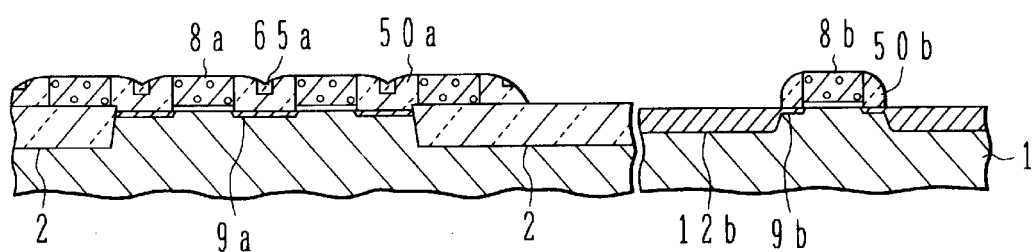

As shown in FIG. 9C, the first $SiO_2$ film 50 and side spacer insulating members 65 are anisotropically etched. This anisotropic etching is performed by RIE using a mixture gas of $CF_4$, $CHF_3$, and Ar. In spaces between the word lines 8a, insulating members 50a of the first $SiO_2$ film 50 are left. The upper surface of the insulating member 50a has a dent. In this dent, an insulating member 65a of a portion of the side spacer insulating member 65 is left.

Side spacer insulating members 50b of the first $SiO_2$ film 50 are left on the side walls of the gate electrode 8b in the logic circuit area. By using the gate electrode 8b and side spacer insulating members 50b as a mask, impurity ions are implanted to form high impurity concentration source/drain regions 12b.

Figure 9D:
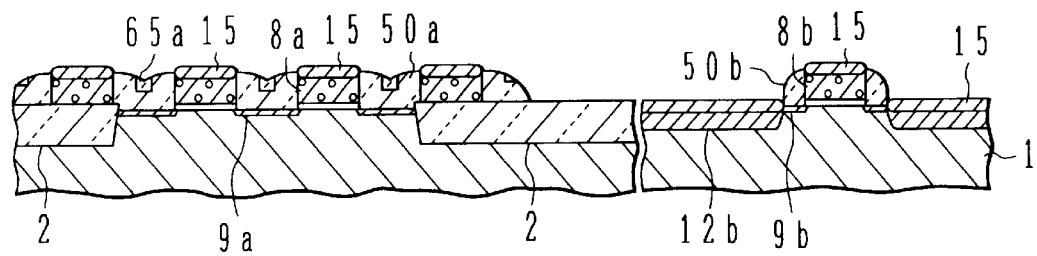

As shown in FIG. 9D, a metal silicide film 15 is formed on the silicon surface by processes similar to the first embodiment shown in FIG. 2A. The end of the metal silicide film 15 formed on the surface of the source/drain region in the logic circuit area contacts the side spacer insulating member 50b.

In the fifth embodiment, after the first $SiO_2$ film 50 shown in FIG. 9A is formed, the surfaces of the source/drain regions 9a in the memory cell array area are not exposed. The source/drain regions 9a in the memory cell array area are therefore not damaged.

Next, with reference to FIGS. 10A to 10D, the sixth embodiment will be described. A substrate shown in FIG. 6A is formed by processes similar to the second embodiment.

Figure 10A:
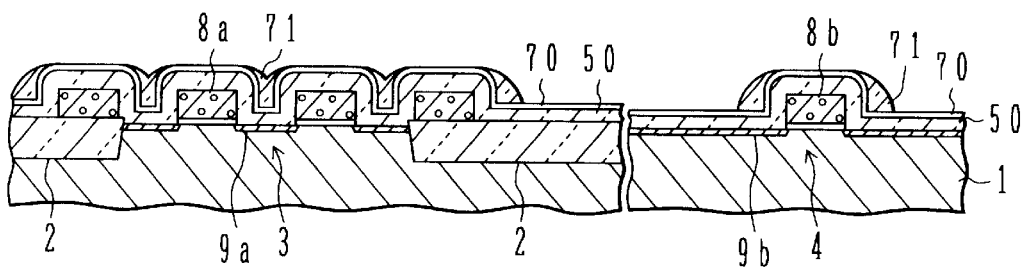
FIGS. 10A to 10D are cross sectional views of a substrate illustrating a method of manufacturing a semiconductor device according to a sixth embodiment of the invention.

As shown in FIG. 10A, on the surface of the first $SiO_2$ film 50, an SiN film 70 is deposited to a thickness of 10 to 30 nm. Side spacer insulating members 71 are formed on the slanted surfaces and side walls of the SiN film 70. The side spacer insulating members 71 are formed by the method similar to that of forming the side spacer insulating members 65 of the fifth embodiment shown in FIG. 9A. As the side spacer insulating member 71, a tetraethylorthosilicate (TEOS) film formed by CVD using $O_3$ and TEOS may be used. The TEOS film is excellent in burying a dent. Spaces between the word lines 8a are buried with the first $SiO_2$ film 50, SiN film 70, and side spacer insulating member 71.

Figure 10B:
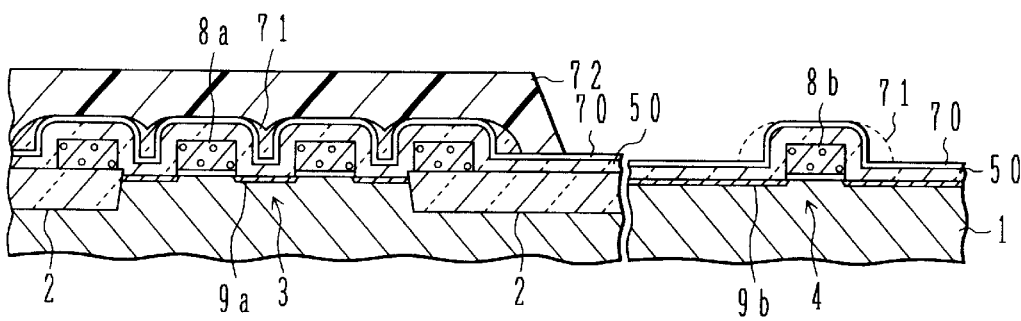

As shown in FIG. 10B, the memory cell array area is covered with a resist pattern 72. The side spacer insulating members 71 in the logic circuit area are removed by RIE using $C_4F_8$ and Ar. The SiN film 70 functions as an etching stopper layer. Therefore, the side spacer insulating members 71 can be removed to leave the first $SiO_2$ film 50 with high reproductivity. After the side spacer insulating members 71 are removed, the resist pattern 72 is removed.

Figure 10C:
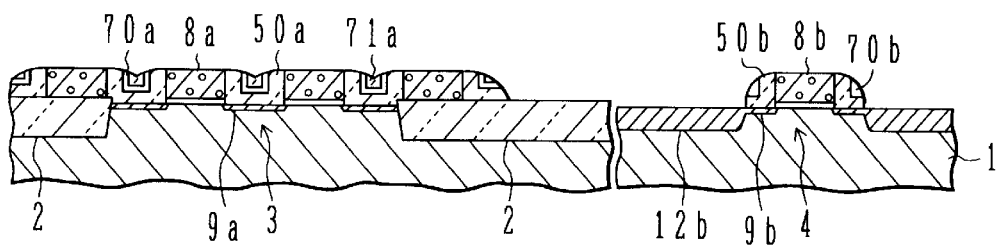

As shown in FIG. 10C, the first $SiO_2$ film 50, SiN film 70, and side spacer insulating member 71 are anisotropically etching. This anisotropic etching is performed by RIE using a mixture gas of $CF_4$, $CHF_3$, and Ar. Insulating members 50a of the first $SiO_2$ film 50 are left in spaces between the word lines 8a. The surface of the insulating member 50a has a dent. An insulating member 70a of the SiN film 70 is left in the dent. An insulating member 71a of the side spacer insulating member 71 is left on the upper surface of the insulating member 70a.

Side spacer insulating members 50b of the first $SiO_2$ are left on the side walls of the gate electrode 8b in the logic circuit area. On the side walls of the side spacer insulating members, insulating members 70b of the SiN film 70 are left. The insulating member 70b buries a groove parallel to the substrate plane formed on the side wall of the side spacer insulating member 50b.

By using the gate electrode 8b and side spacer insulating members 50b as a mask, impurity ions are implanted to form high impurity concentration source/drain regions 12b.

Figure 10D:
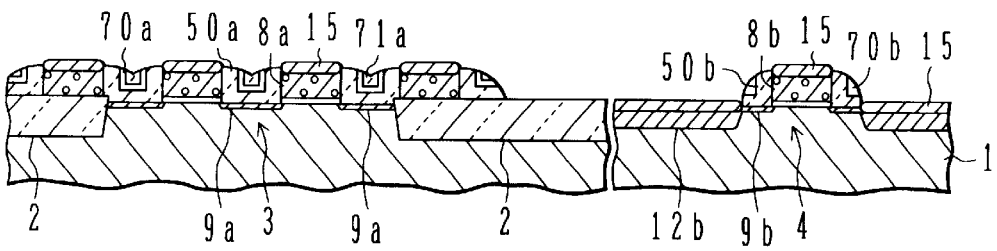

As shown in FIG. 10D, a metal silicide film 15 is formed on the silicon surface by processes similar to the first embodiment shown in FIG. 2A. The end of the metal silicide film 15 on the side of the gate electrode 8b formed on the surface of the source/drain region in the logic circuit area contacts the side spacer insulating member 50b.

Similar to the fifth embodiment, in the sixth embodiment, after the first SiO$_2$ film 50 shown in FIG. 10A is deposited, the surfaces of the source/drain regions 9a in the memory cell array area are not exposed. The surface of the source/drain region 9a can therefore be maintained clean. While the side spacer insulating members 71 are removed in the process shown in FIG. 10B, the SiN layer 70 is used as the etching stopper layer so that the side spacer insulating member 50b can be left with high reproductivity.

After the side spacer insulating members 71 are removed in the process shown in FIG. 10B, the SiN film 70 in the logic circuit area may be etched by using the resist pattern 72 as a mask. For example, the SiN film 70 is etched by RIE using a mixture gas of CHF$_3$ and O$_2$. If the SiN film 70 in the logic circuit area is removed, the insulating members 70b are not left on the side walls of the gate electrode 8b in the logic circuit area shown in FIG. 10D.

Fine insulating members 70b are likely to be removed at a later process. If the insulating member 70b is not left, dusts to be caused by removal of the insulating member 70b can be prevented.

Figure 11A:
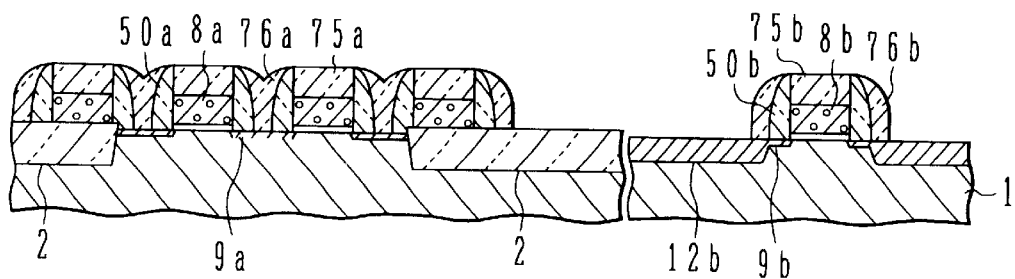
FIGS. 11A to 11D are cross sectional views of a substrate illustrating a method of manufacturing a semiconductor device according to a seventh embodiment of the invention.

Next, with reference to FIGS. 11A to 11D, the seventh embodiment will be described. In the seventh embodiment, as shown in FIG. 11D, the upper surface of the metal silicide film 15 of the second embodiment shown in FIG. 6D is covered with insulating members 77a and 77b of SiN. Further, in the sixth embodiment, the side spacer insulating members 50a and 50b of SiO$_2$ are formed on the side walls of the word lines 8a and gate electrode 8b, whereas in the seventh embodiment, these side spacer insulating members are made of SiN. Namely, the upper surfaces and side walls of the word lines 8a and gate electrode 8b are covered with the SiN film.

The processes up to those processes of FIG. 11A will be described first. In place of the word lines 8a shown in FIG. 6A, a two-layer structure is used having a word line 8a made of polysilicon and an insulating member 75a made of BSG or PSG. Similarly, in place of the gate electrode 8b shown in FIG. 6A, a two-layer structure is used having a gate electrode 8b made of polysilicon and an insulating member 75b made of BSG or PSG. By using these two-layer structures as a mask, impurity ions are implanted to form source/drain regions 9a of MOSFET's in the memory cell array area and low impurity concentration source/drain regions 9b of MOSFET's in the logic circuit area.

Side spacer insulating members 50a and 50b of SiN are formed on the side walls of the two-layer structures. The side spacer insulating members 50a and 50b are formed by depositing an SiN film by CVD to a thickness of 0.03 to 0.1 μm and thereafter by performing RIE using a mixture gas of CF$_4$, CHF$_3$, and Ar. Ion implantation is again performed to form high impurity concentration source/drain regions 12b of MOSFET's in the logic circuit area.

Side spacer insulating members 76a and 76b of Sio$_2$ are formed on the side walls of the side spacer insulating members 50a and 50b. The side spacer insulating members 76a and 76b are formed by depositing an SiO$_2$ film by CVD to a thickness of 0.05 to 0.2 μm and thereafter by performing RIE using a mixture gas of CF$_4$, CHF$_3$, and Ar. Spaces between the word lines 8a are buried with the insulating members 50a and 76a.

Figure 11B:
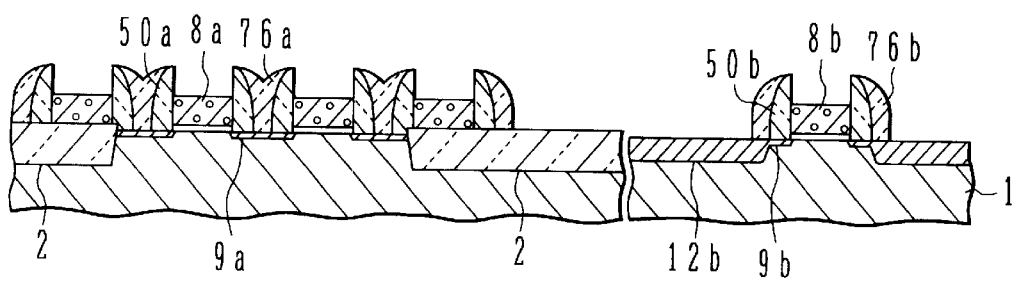

As shown in FIG. 11B, the insulating members 75a and 75b are removed by using hydrofluoric acid or hydrofluoric acid vapor to expose the upper surfaces of the word lines 8a and gate electrode 8b. Since BSG or PSG has a lower etching resistance relative to hydrofluoric acid than the side spacer insulating members 50a, 50b, 76a, and 76b, the latter can be left unetched with high reproductivity.

Figure 11C:
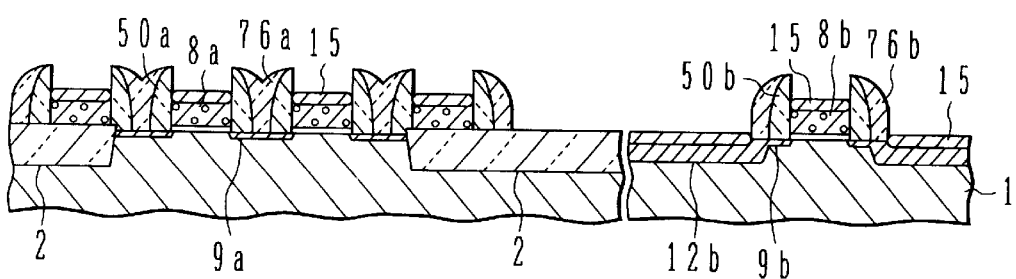
Figure 11D:
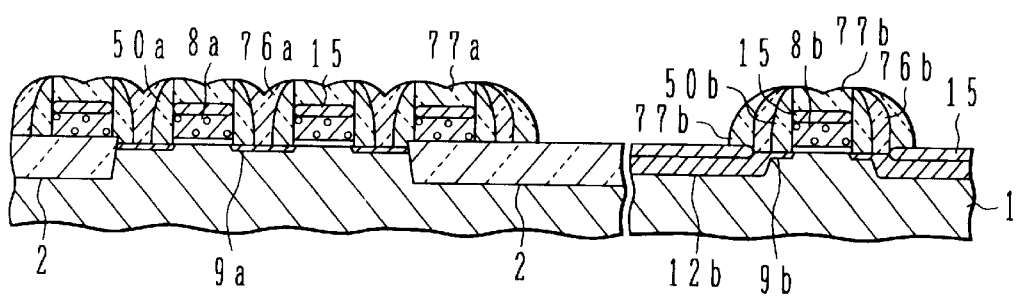

As shown in FIG. 11C, a metal silicide film 15 is formed on the upper surfaces of the exposed word lines 8a and gate electrode 8b and on the surfaces of the exposed high impurity concentration source/drain regions 12b. Since the surfaces of the source/drain regions 9a in the memory cell array area are covered with the buried insulating members 50a and 76a, the metal silicide film is not formed on these surfaces of the source/drain regions 9a.

As shown in FIG. 11D, insulating members 77a and 77b of SiN are formed on the metal silicide films 15 formed on the word lines 8a and gate electrode 8b and on the side walls of the side spacer insulating members 76b. The insulating members 77a and 77b are formed by depositing an SiN film by CVD to a thickness of 100 to 200 nm and thereafter by performing RIE using a mixture gas of CF$_4$, CHF$_3$, and Ar.

In the seventh embodiment, the upper surfaces and side walls of the word lines 8a are covered respectively with the insulating members 77a and 50a of SiN. While the contact hole 24 shown in FIG. 2C is formed, the insulating members 77a and 50a of SiN protect the word lines 8a. Therefore, even if an exposure mask is misaligned, the word line 8a will not be exposed in the contact hole 24 so that a contact between the word line 8a and storage capacitor 25 can be avoided. Even if the contact hole 24 is formed by using an etching mask having an opening larger than the space between the word lines 8a, the contact hole 24 can be formed in a self-alignment manner.

Next, with reference to FIGS. 12A to 12D, the eighth embodiment will be described. In the seventh embodiment, the insulating members covering the upper surfaces and side walls of the word lines 8a and gate electrode 8b are made of SiN, whereas in the eighth embodiment, these insulating members are made of siO$_2$.

Figure 12A:
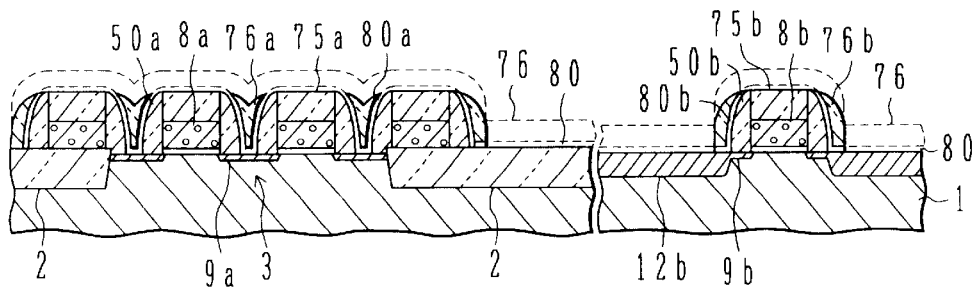
FIGS. 12A to 12D are cross sectional views of a substrate illustrating a method of manufacturing a semiconductor device according to an eighth embodiment of the invention.

The processes up to those shown in FIG. 12A will be described first. Similar to the seventh embodiment shown in FIG. 11A, the word lines 8a, gate electrode 8b, and insulating members 75a and 75n on the word lines and gate electrode are formed. By using these two-layer structures as a mask, impurity ions are implanted to form source/drain regions 9a of MOSFET's in the memory cell array area and low impurity concentration source/drain regions 9b of MOSFET's in the logic circuit area.

Side spacer insulating members 50a and 50b of SiO$_2$ are formed on the side walls of the two-layer structures. The side spacer insulating members 50a and 50b are formed by depositing an SiO$_2$ film by CVD to a thickness of 0.03 to 0.1 μm and thereafter by performing RIE using a mixture gas of CF$_4$, CHF$_3$, and Ar. Ion implantation is again performed to form high impurity concentration source/drain regions 12b of MOSFET's in the logic circuit area.

An SiO$_2$ film 80 of 10 to 30 nm in thickness and an SiN film 76 of 50 to 200 nm in thickness are deposited by CVD over the whole substrate surface. The SiO$_2$ film 80 provides a function of improving tight adhesion between the silicon substrate 1 and SiN film 76. The SiN film 76 and SiO$_2$ film 80 are anisotropically etched by RIE using a mixture gas of CF$_4$, CHF$_3$, and Ar to expose the upper surfaces of the insulating members 75a and 75b on the word lines 8a and gate electrode 8b. Spaces between the word lines 8a in the memory cell array area are buried with the insulating members 50a and 80a of SiO$_2$ and the insulating member 76a of SiN.

In the logic circuit area, the insulating member 80b of SiO$_2$ covers the side spacer insulating members 50b and a partial surface area of the high impurity concentration source/drain regions 12b continuous with the side spacer insulating member 50b, in conformity with the topology of the underlying layer. The insulating member 76b of SiO$_2$ covers the surface of the insulating member 80b.

Figure 12B:
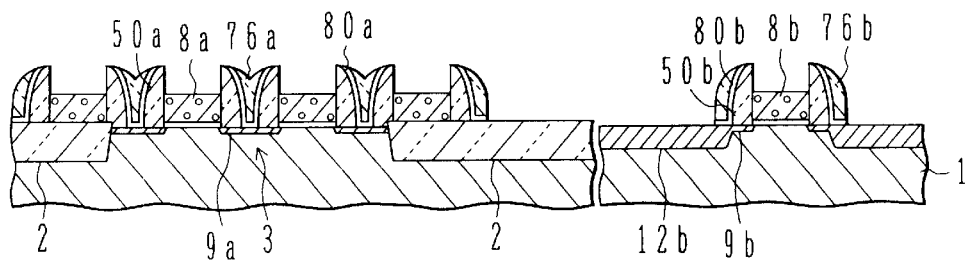
Figure 12C:
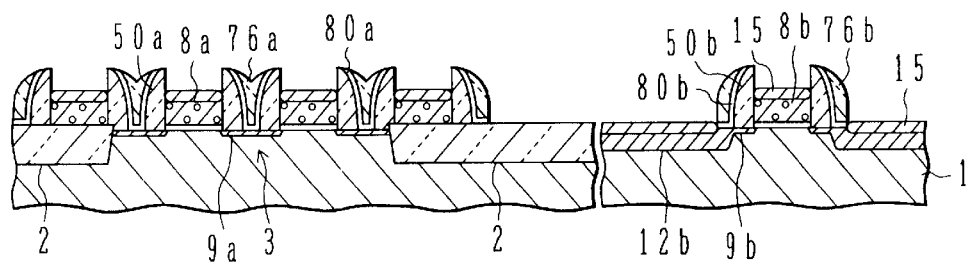

As shown in FIG. 12B, the insulating members 75a and 75b are removed by using hydrofluoric acid or hydrofluoric acid vapor to expose the upper surfaces of the word lines 8a and gate electrode 8b. As shown in FIG. 12C, a metal silicide film 15 is formed on the upper surfaces of the exposed word lines 8a and gate electrode 8b and on the surfaces of the exposed high impurity concentration source/drain regions 12b.

Figure 12D:
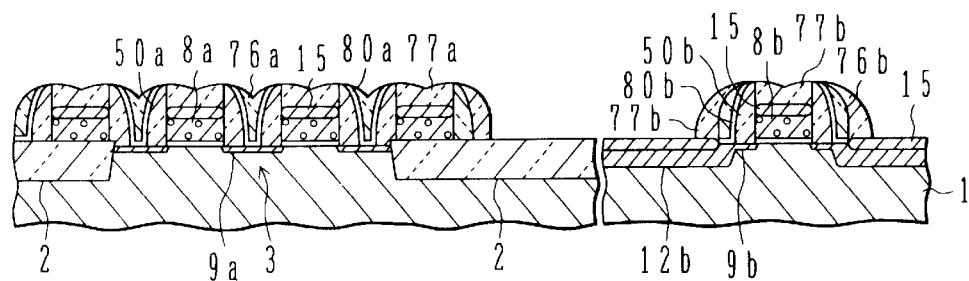

Similar to FIG. 11D, as shown in FIG. 12D, insulating members 77a and 77b of SiO$_2$ instead of SiN are formed on the metal silicide films 15 formed on the word lines 8a and gate electrode 8b and on the side walls of the side spacer insulating members 76b.

In the eighth embodiment, the upper surfaces and side walls of the word lines 8a are covered respectively with the insulating members 77a and 50a of SiO$_2$. If the BPSG films 23 and 18 shown in FIG. 2C are made of SiN instead of BPSG, the contact hole 24 shown in FIG. 2C can be formed in a self-alignment manner.

Figure 13A:
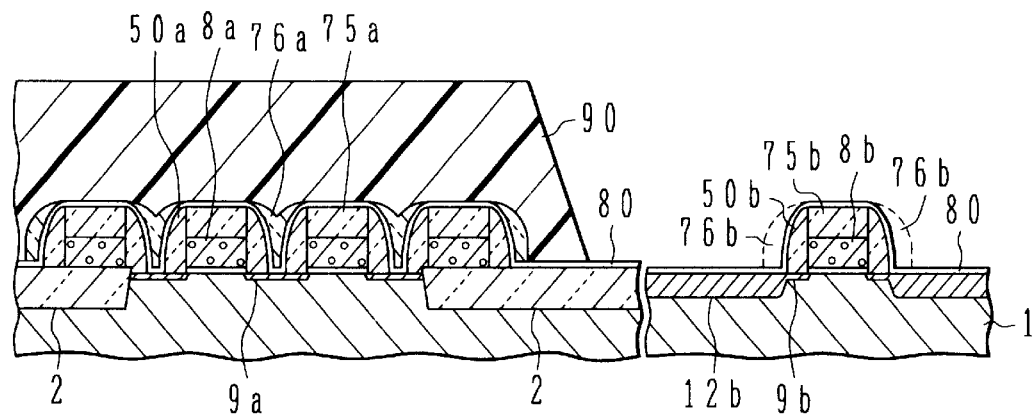
FIGS. 13A to 13C are cross sectional views of a substrate illustrating a method of manufacturing a semiconductor device according to a ninth embodiment of the invention.
Figure 13B:
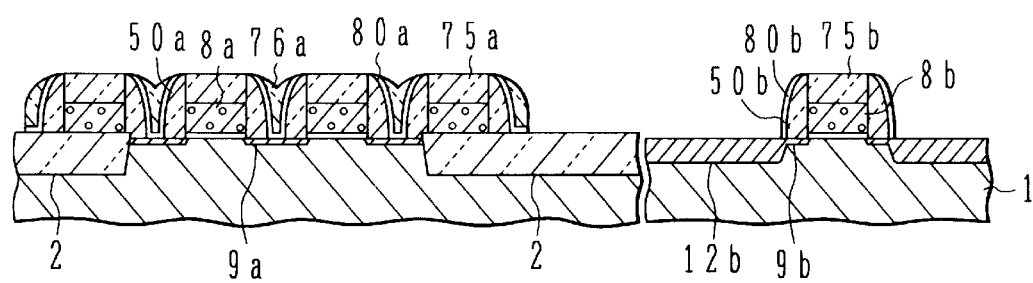
Figure 13C:
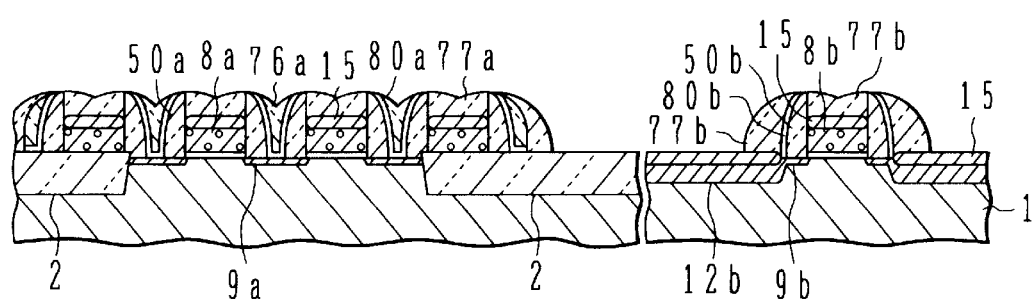

Next, with reference to FIGS. 13A to 13C, the ninth embodiment sill be described. In the eighth embodiment, in the process shown in FIG. 12A, the surfaces of insulating members 75a and 75b made of BSG or PSG are exposed by etching the SiN film 76 and Sio$_2$ film 80 by using a mixture gas of CF$_4$, CHF$_3$, and Ar. In the ninth embodiment, only the SiN film 76 is etched by RIE using a mixture gas of CHF$_3$ and O$_2$. This etching stops at the SiO$_2$ film 80 under the SiN film 76 so that the SiO$_2$ film 80 is left on the insulating members 75a and 75b.

FIG. 13A shows the SiO$_2$ film 80 left unetched. The memory cell array area is covered with a resist pattern 90. The side spacer insulating member 76b is removed by using mixture gas of CHF$_3$ and O$_2$ under the conditions that the etching progresses isotropically. Thereafter, the resist pattern 90 is removed.

As shown in FIG. 13B, the SiO$_2$ film 80 left on the insulating members 76a and 76b is removed by RIE using a mixture gas of CF$_4$, CHF$_3$, and Ar. The structure shown in FIG. 13C is obtained by performing the processes of FIGS. 12B to 12D.

As shown in FIG. 13C, in the ninth embodiment, a partial surface area of the high impurity source/drain region 12b continuous with the side wall of the side spacer insulating member 50b is not covered with the insulating member 80b. Therefore, the end of the metal silicide film on the surface of the source/drain region on the side of the gate electrode 8b becomes nearer to the gate electrode 8b than the eighth embodiment shown in FIG. 12D. The resistance of the source/drain region can therefore be lowered.

Next, with reference to FIGS. 14A to 14E, the tenth embodiment will be described.

Figure 14A:
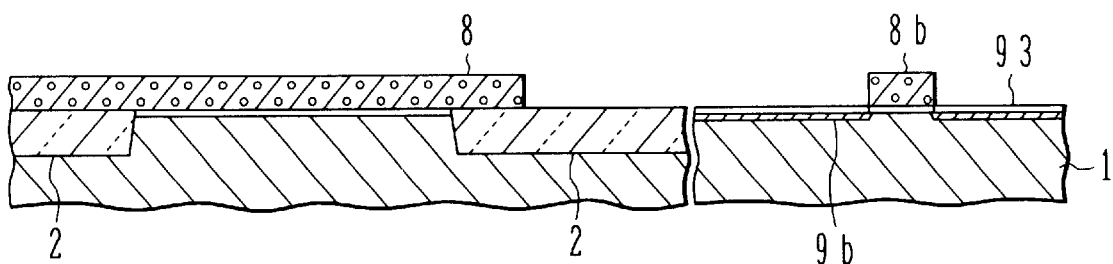
FIGS. 14A to 14E are cross sectional views of a substrate illustrating a method of manufacturing a semiconductor device according to a tenth embodiment of the invention.

As shown in FIG. 14A, a silicon substrate 1 has element isolation structures 2 formed on its surface, similar to those of the first embodiment shown in FIG. 1A. A gate oxide film 93 is formed through thermal oxidation on the surface of the substrate 1. A polysilicon film 8 is deposited on the gate oxide film 93. The polysilicon film 8 in the logic circuit area is patterned to form a gate electrode 8b. In the memory cell array area, the polysilicon film 8 is not patterned. Impurity ions are implanted to form low impurity concentration source/drain regions in the logic circuit area.

Figure 14B:
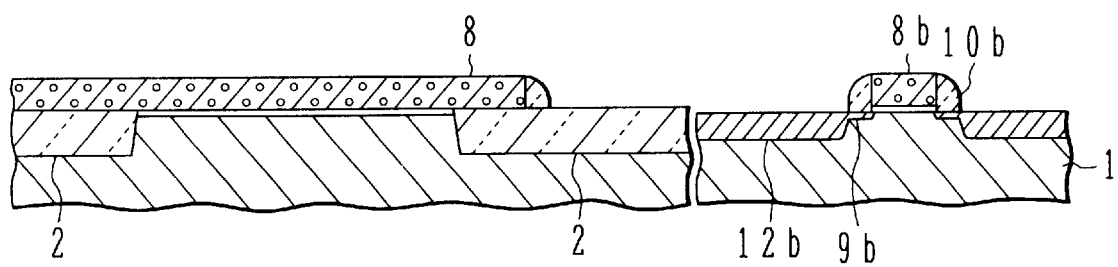

As shown in FIG. 14B, side spacer insulating members 10b of SiO$_2$ are formed on the side walls of the gate electrode 8b. The side spacer insulating members 10b are formed by depositing an SiO$_2$ film by CVD to a thickness of 0.03 to 0.2 μm and thereafter by performing anisotropic RIE. Impurity ions are again implanted to form high impurity concentration source/drain regions in the logic circuit area.

Figure 14C:
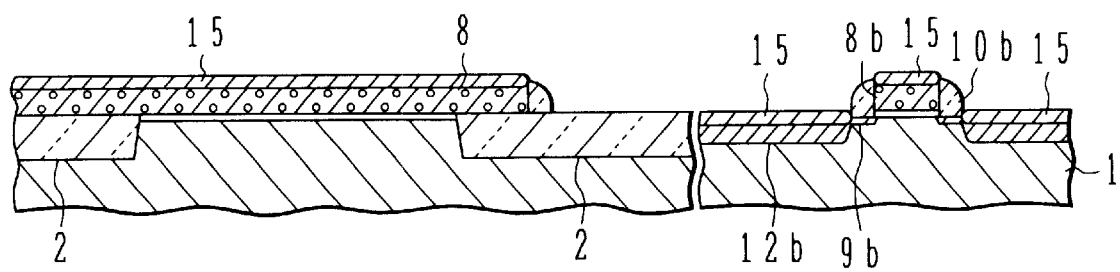

As shown in FIG. 14C, a metal silicide film 15 is formed on the upper surfaces of the polysilicon film 8 in the memory cell array area, and on the upper surface of the gate electrode 8b and surfaces of the high impurity concentration source/drain regions 12b in the logic circuit area.

Figure 14D:
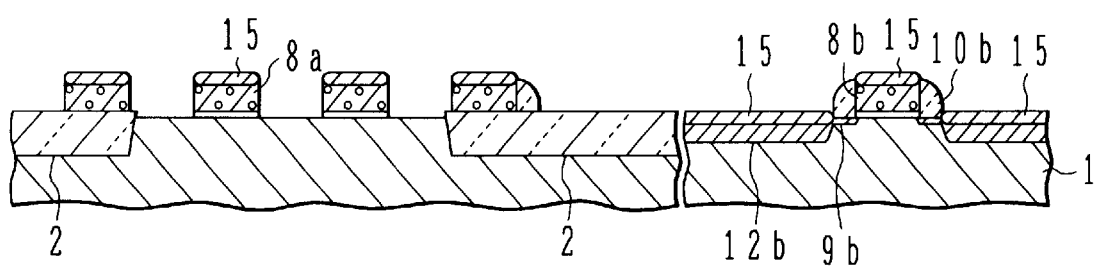

As shown in FIG. 14D, the polysilicon film 8 and metal silicide film 15 are patterned in the memory cell array area to leave word lines 8a and metal silicide films formed on the upper surfaces of the wordlines, while the logic circuit area is covered with a resist pattern.

Figure 14E:
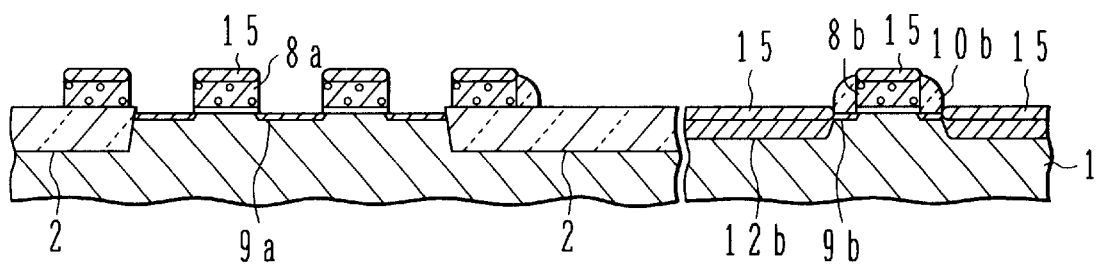

As shown in FIG. 14E, impurity ions are implanted into the memory cell array area to form source/drain regions 9a.

Similar to the first to ninth embodiments, also in the tenth embodiment, the metal silicide film can be formed only on the surfaces of the source/drain regions of the logic circuit area without forming it on the surfaces of the source/drain regions 9a in the memory cell array area. The side spacer insulating film 10b formed in the process shown in FIG. 14B is not required to bury the spaces between the word lines. It is therefore possible to optimize the size of the low impurity concentration region 9b in the logic circuit area.

Next, with reference to FIGS. 15A to 15C, the eleventh embodiment will be described. The processes from FIG. 14A to FIG. 14C are used in common with the tenth embodiment.

Figure 15A:
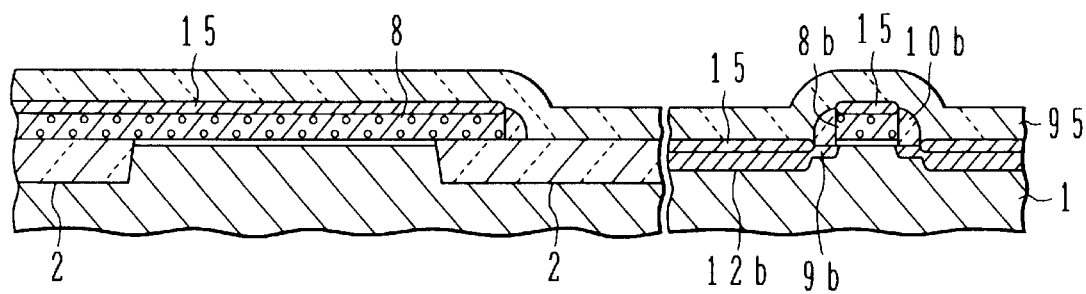
FIGS. 15A to 15C are cross sectional views of a substrate illustrating a method of manufacturing a semiconductor device according to an eleventh embodiment of the invention.

As shown in FIG. 15A, an SiN film 95 of 50 to 200 nm in thickness is deposited over the whole substrate surface.

Figure 15B:
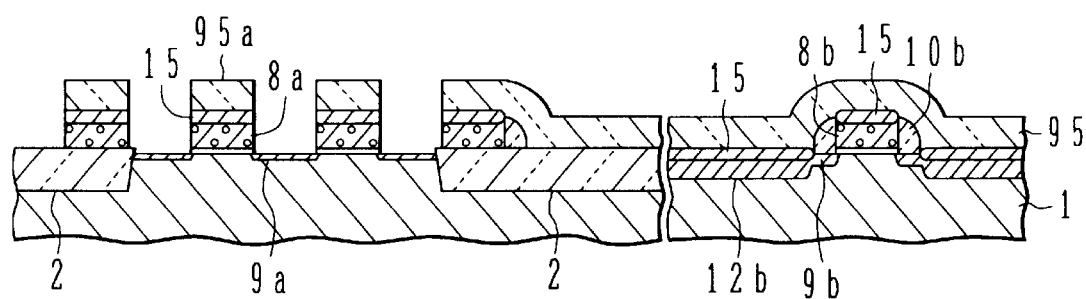

As shown in FIG. 15B, in the memory cell array area, an SiN film 95, a metal silicide film 15, and a polysilicon film 8 are patterned to leave word lines 8a, metal silicide films 15 formed thereon, and insulating members 95a of SiN. In the logic circuit area, the SiN film 95 is left over the whole area. Impurity ions are implanted into the memory cell array area to form source/drain regions 9a.

Figure 15C:
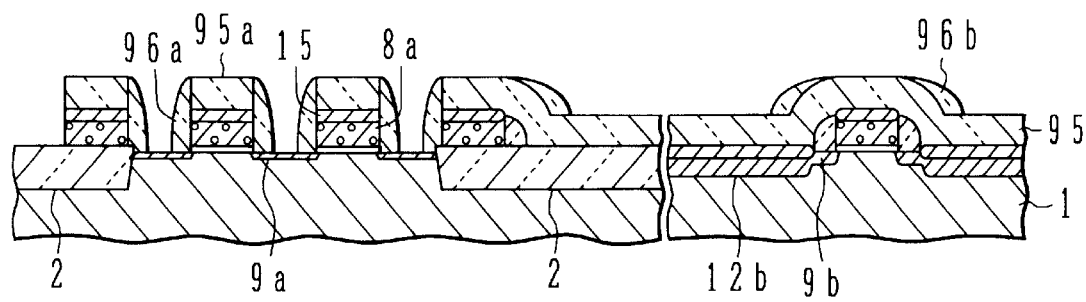

As shown in FIG. 15C, side spacer insulating members 96a are formed on the side walls of each lamination structure made of the word line 8a, metal silicide film 15, and insulating member 95a. In the logic circuit area, side spacer insulating members 96b are formed on the convex skirt surface of the SiN film 95 in an area corresponding to the gate electrode 8b.

Similar to the seventh embodiment, in the eleventh embodiment, the insulating members 95a and 96b of SiN cover the upper surfaces and side walls of the word lines 8a. Therefore, the contact hole 24 shown in FIG. 2C can be formed in a self-alignment manner.

In the eleventh embodiment, the insulating members of SiN cover the upper surface and side walls of the word line 8a. The insulating members of SiO$_2$ may be used similar to the eighth embodiment.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
    a semiconductor substrate having a principal surface defined with first and second regions;
    two projected patterns disposed spaced apart from each other by a certain distance and formed on the principal surface in the first region, said two projected patterns running on a first active region and on an element isolation region around the first active region in the first region;
    a first metal silicide film formed on a surface of an active region in the principal surface in the second region, and exposing a surface of an active region in the first region; and
    a burying member for covering side walls of said two projected patterns and burying a space between said two projected patterns at least in the element isolation region, said burying member exposing top surfaces of said two projected patterns.

2. A semiconductor device according to claim 1, wherein said two projected patterns are made of silicon and form two gate electrodes of two first MOSFET's over the first active region, and the semiconductor device further comprises:
    a second MOSFET formed in the second region, said first metal silicide film being formed on surfaces of source/drain regions of the second MOSFET;
    a second metal silicide film formed on an upper surface of the gate electrode of each of the two first MOSFET's; and
    a third metal silicide film formed on an upper surface of a gate electrode of said second MOSFET.

3. A semiconductor device according to claim 2, further comprising a capacitor connected to one of source and drain regions of each of said two first MOSFET's, the first MOSFET and the capacitor constituting one memory cell.

4. A semiconductor device according to claim 2, wherein the drain region of the second MOSFET has an LDD structure including a high impurity concentration region and a low impurity concentration region formed at an end portion of the high impurity concentration region on the side of the gate electrode, and an end of said first metal silicide film on the side of the gate electrode formed on the surface of the drain region retracts from an end of the high impurity concentration region on a side of the gate electrode.

5. A semiconductor device according to claim 2, wherein said burying member comprises:
    a first insulating member covering the side walls of said two projected patterns; and
    a second insulating member covering side walls of said first insulating member and burying a space between said two projected patterns, said second insulating member having an etching resistance different from said first insulating member,
    the semiconductor device further comprises a third insulating member covering side walls of the gate electrode of said second MOSFET and made of a same material as said first insulating member, and
    an end of said first metal silicide film on the side of the gate electrode is in contact with said third insulating member.

6. A semiconductor device according to claim 2, wherein said burying member comprises:
    a first insulating member covering the side walls of each of said two projected patterns;
    a second insulating member covering continuously from a side wall of one of said first insulating members facing each other to a side wall of the other, said second insulating member having an etching resistance different from said first insulating member; and
    a third insulating member covering a surface of said second insulating member and burying a space between said two projected patterns, said third insulating member having an etching resistance different from said second first insulating member,
    the semiconductor device further comprises:
    a fourth insulating member covering side walls of the gate electrode of said second MOSFET and made of a same material as said first insulating member; and
    a fifth insulating member covering side walls of said fourth insulating member and made of a same material as said second insulating member, and
    an end of said first metal silicide film on the side of the gate electrode is in contact with said fifth insulating member.

7. A semiconductor device according to claim 2, wherein said burying member comprises:
    a first insulating member covering the side walls of each of said two projected patterns and the principal surface of said semiconductor substrate, said first insulating member having a dent on an upper surface between said two projected patterns; and
    a second insulating member filling the upper surface dent of said first insulating member and having an etching resistance different from said first insulating member,
    the semiconductor device further comprises:
    a third insulating member covering side walls of the gate electrode of said second MOSFET and made of a same material as said first insulating member, and
    an end of said first metal silicide film on the side of the gate electrode is in contact with said third insulating member.

8. A semiconductor device according to claim 2, wherein said burying member comprises:
    a first insulating member covering the side walls of each of said two projected patterns and the principal surface of said semiconductor substrate, said first insulating member having a dent on an upper surface between said two projected patterns;
    a second insulating member covering an inner surface of the upper surface dent of said first insulating member in conformity with a topology of the upper surface dent, said second insulating member being made of a material having an etching resistance different from said first insulating member; and
    a third insulating member filling a dent defined in the upper surface of said second insulating member and having an etching resistance different from said second insulating member,
    the semiconductor device further comprises:
    a fourth insulating member covering side walls of the gate electrode of said second MOSFET and made of a same material as said first insulating member, and
    an end of said first metal silicide film on the side of the gate electrode is in contact with said fourth insulating member.

9. A semiconductor device according to claim 8, further comprising a groove formed in each side wall of said fourth insulating member in parallel to the principal surface, and a fifth insulating member filling the groove and being made of a same material as said second insulating member.

10. A semiconductor device according to claim 2, further comprising a first insulating member formed on an upper surface of said second metal silicide film, wherein said burying member comprises:
- a second insulating member covering the side walls of each of said two projected patterns and side walls of said first insulating member, said second insulating member being made of a same material as said first insulating member; and
- a third insulating member covering side walls of said second insulating member and filling a space between said two projected patterns and said first insulating member formed thereon, said third insulating member being made of a material having an etching resistance different from said first insulating member, the semiconductor device further comprises:
  - a fourth insulating member covering an upper surface of said third metal silicide film and made of a same material as said first insulating member;
  - a fifth insulating member covering side walls of the gate electrode of said second MOSFET and side walls of said fourth insulating member and made of a same material as said second insulating member;
  - a sixth insulating member covering side walls of said fifth insulating member and made of a same material as said third insulating member; and
  - a seventh insulating member covering side walls of said sixth insulating member and made of a same material as said first insulating member, and
  - an end of said first metal silicide film on the side of the gate electrode is in contact with said sixth insulating member.

11. A semiconductor device according to claim 2, further comprising a first insulating member formed on an upper surface of said second metal silicide film, wherein said burying member comprises:
- a second insulating member covering the side walls of each of said two projected patterns and side walls of said first insulating member, said second insulating member being made of a same material as said first insulating member;
- a third insulating member covering continuously from a side wall of one of said second insulating members facing each other to a side wall of the other; and
- a fourth insulating member covering a surface of said third insulating member and burying a space between said two projected patterns and said first insulating member formed thereon, said fourth insulating member having an etching resistance different from said third insulating member, the semiconductor device further comprises:
- a fifth insulating member formed on an upper surface of said third metal silicide film and made of a same material as said first insulating member;
- a sixth insulating member covering side walls of the gate electrode of said second MOSFET and side walls of said fifth insulating member and made of a same material as said second insulating member;
- a seventh insulating member covering side walls of said sixth insulating member and a partial surface area of the source/drain region of said second MOSFET continuous with the side wall of said sixth insulating member, in conformity with a topology of an underlying layer surface, said seventh insulating member being made of a same material as said third insulating member;
- an eighth insulating member covering a surface of said seventh insulating member and made of a same material as said fourth insulating member; and
- a ninth insulating member covering side walls of said eighth insulating member and made of a same material as said first insulating member, and
- an end of said first metal silicide film on the side of the gate electrode is in contact with said seventh insulating member.

12. A semiconductor device according to claim 2, further comprising a first insulating member formed on an upper surface of said second metal silicide, wherein said burying member comprises:
- a second insulating member covering the side walls of each of said two projected patterns and side walls of said first insulating member, said second insulating member being made of a same material as said first insulating member;
- a third insulating member covering continuously from a side wall of one of said second insulating members facing each other to a side wall of the other; and
- a fourth insulating member covering a surface of said third insulating member and burying a space between said two projected patterns and said first insulating member formed thereon, said fourth insulating member having an etching resistance different from said third first insulating member, the semiconductor device further comprises:
- a fifth insulating member formed on an upper surface of said third metal silicide film and made of a same material as said first insulating member;
- a sixth insulating member covering side walls of the gate electrode of said second MOSFET and side walls of said fifth insulating member and made of a same material as said second insulating member;
- a seventh insulating member covering side walls of said sixth insulating member and made of a same material as said third insulating member; and
- an eighth insulating member covering side walls of said seventh insulating member and made of a same material as said first insulating member, and
- an end of said first metal silicide film on the side of the gate electrode is in contact with said seventh insulating member.

13. A semiconductor device according to claim 1, wherein said burying member exposes whole top surfaces of said two projected patterns.

14. A semiconductor device according to claim 1, wherein said burying member is made of insulating material.

15. A semiconductor device according to claim 1, further comprising:
- an insulating layer covering said first metal silicide film;
- a contact hole through said insulating layer, said contact hole exposing a partial surface area of said first metal silicide film; and
- a conductive member burying said contact hole.

* * * * *